US009269646B2

(12) United States Patent
Luo et al.

(10) Patent No.: US 9,269,646 B2
(45) Date of Patent: Feb. 23, 2016

(54) SEMICONDUCTOR DIE ASSEMBLIES WITH ENHANCED THERMAL MANAGEMENT AND SEMICONDUCTOR DEVICES INCLUDING SAME

(75) Inventors: Shijian Luo, Boise, ID (US); Xiao Li, Boise, ID (US); Jian Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 318 days.

(21) Appl. No.: 13/613,235

(22) Filed: Sep. 13, 2012

(65) Prior Publication Data

US 2013/0119527 A1    May 16, 2013

Related U.S. Application Data

(60) Provisional application No. 61/559,659, filed on Nov. 14, 2011, provisional application No. 61/559,664, filed on Nov. 14, 2011.

(51) Int. Cl.
*H01L 23/52* (2006.01)
*H01L 23/36* (2006.01)
(Continued)

(52) U.S. Cl.
CPC ............ *H01L 23/36* (2013.01); *H01L 23/3677* (2013.01); *H01L 23/3736* (2013.01);
(Continued)

(58) Field of Classification Search
CPC . H01L 25/0657; H01L 25/112; H01L 25/117; H01L 25/071; H01L 25/04; H01L 25/041; H01L 25/042; H01L 23/36; H01L 23/3677; H01L 23/42; H01L 2225/06589; H01L 2225/06544
USPC ........... 257/686, E25.006, E25.013, E25.021, 257/E25.027, E23.085, 685, 723, 777, 257/E24.021, 734
See application file for complete search history.

(56) References Cited

U.S. PATENT DOCUMENTS

| 5,536,907 | A | 7/1996 | Miyawaki et al. |
| 5,789,810 | A | 8/1998 | Gross et al. |

(Continued)

FOREIGN PATENT DOCUMENTS

| JP | 2006-210892 A | 8/2006 |
| JP | 2009-246258 A | 10/2009 |

(Continued)

OTHER PUBLICATIONS

Sikka et al., An Efficient Lid Design for Cooling Stacked Flip-Chip 3D Packages, 13th IEEE ITHERM Conference on May 30, 2012-Jun. 1, 2012, pp. 606-611.

(Continued)

*Primary Examiner* — Jasmine Clark
(74) *Attorney, Agent, or Firm* — TraskBritt

(57) ABSTRACT

A semiconductor die assembly comprises a plurality of semiconductor dice in a stack. Another semiconductor die is adjacent to the stack and has a region, which may comprise a relatively higher power density region, extends peripherally beyond the stack. Conductive elements extend between and electrically interconnect integrated circuits of semiconductor dice in the stack and of the other semiconductor die. Thermal pillars are interposed between semiconductor dice of the stack, and a heat dissipation structure, such as a lid, is in contact with an uppermost die of the stack and the higher power density region of the other semiconductor die. Other die assemblies, semiconductor devices and methods of managing heat transfer within a semiconductor die assembly are also disclosed.

28 Claims, 6 Drawing Sheets

(51) Int. Cl.
*H01L 23/367* (2006.01)
*H01L 23/373* (2006.01)
*H01L 23/42* (2006.01)
*H01L 25/065* (2006.01)
*H01L 25/18* (2006.01)

(52) U.S. Cl.
CPC ............ *H01L23/42* (2013.01); *H01L 25/0657* (2013.01); *H01L 25/18* (2013.01); *H01L 2224/73204* (2013.01); *H01L 2225/06513* (2013.01); *H01L 2225/06544* (2013.01); *H01L 2225/06589* (2013.01); *H01L 2924/15311* (2013.01)

(56) References Cited

U.S. PATENT DOCUMENTS

| | | | |
|---|---|---|---|
| 6,111,313 | A | 8/2000 | Kutlu |
| 6,316,786 | B1 * | 11/2001 | Mueller et al. .................. 257/40 |
| 6,320,257 | B1 | 11/2001 | Jayaraj et al. |
| 6,458,609 | B1 | 10/2002 | Hikita et al. |
| 6,462,410 | B1 | 10/2002 | Novotny et al. |
| 6,637,506 | B2 | 10/2003 | Gektin et al. |
| 6,649,443 | B2 | 11/2003 | Gektin |
| 6,853,068 | B1 | 2/2005 | Djekic |
| 6,906,413 | B2 | 6/2005 | Bish et al. |
| 7,119,433 | B2 | 10/2006 | Corbin, Jr. et al. |
| 7,186,590 | B2 | 3/2007 | Alcoe et al. |
| 7,239,020 | B2 * | 7/2007 | Morkner ........................ 257/777 |
| 7,268,020 | B2 | 9/2007 | Vogt |
| 7,273,090 | B2 | 9/2007 | Crocker et al. |
| 7,352,068 | B2 * | 4/2008 | Kuroda et al. ................. 257/777 |
| 7,506,527 | B2 | 3/2009 | Anderson |
| 7,518,219 | B2 | 4/2009 | Bish et al. |
| 7,541,217 | B1 * | 6/2009 | Shih et al. ...................... 438/109 |
| 7,547,582 | B2 | 6/2009 | Brunschwiler et al. |
| 7,781,883 | B2 | 8/2010 | Sri-Jayantha et al. |
| 7,928,562 | B2 | 4/2011 | Arvelo et al. |
| 7,939,364 | B2 | 5/2011 | Gektin et al. |
| 7,964,951 | B2 | 6/2011 | Refai-Ahmed |
| 2003/0057540 | A1 | 3/2003 | Shieh |
| 2004/0042178 | A1 | 3/2004 | Gektin et al. |
| 2004/0074630 | A1 | 4/2004 | Sen et al. |
| 2004/0262372 | A1 | 12/2004 | Houle et al. |
| 2006/0044773 | A1 * | 3/2006 | Akram et al. .................. 361/790 |
| 2006/0261467 | A1 | 11/2006 | Colgan et al. |
| 2007/0023887 | A1 * | 2/2007 | Matsui ........................... 257/686 |
| 2007/0145571 | A1 | 6/2007 | Lee et al. |
| 2008/0001277 | A1 | 1/2008 | Wen et al. |
| 2008/0042261 | A1 | 2/2008 | Wolter et al. |
| 2008/0099909 | A1 | 5/2008 | Baek et al. |
| 2008/0122067 | A1 | 5/2008 | Wang |
| 2009/0057880 | A1 | 3/2009 | Baek et al. |
| 2009/0161402 | A1 | 6/2009 | Oh et al. |
| 2009/0267194 | A1 | 10/2009 | Chen |
| 2010/0019377 | A1 | 1/2010 | Arvelo et al. |
| 2010/0078790 | A1 | 4/2010 | Ito et al. |
| 2010/0078807 | A1 | 4/2010 | Schulz |
| 2010/0095168 | A1 | 4/2010 | Jeddeloh |
| 2010/0187670 | A1 | 7/2010 | Lin et al. |
| 2010/0315787 | A1 | 12/2010 | Li et al. |
| 2010/0320588 | A1 | 12/2010 | Dahilig et al. |
| 2012/0038057 | A1 | 2/2012 | Bartley et al. |
| 2013/0119528 | A1 | 5/2013 | Groothuis et al. |

FOREIGN PATENT DOCUMENTS

| | | |
|---|---|---|
| JP | 2010-251427 A | 11/2010 |
| KR | 100874910 B1 | 12/2008 |
| KR | 1020110037066 A | 4/2011 |
| WO | 2008108335 A1 | 9/2008 |

OTHER PUBLICATIONS

Office Action for U.S. Appl. No. 13/613,540 dated Aug. 27, 2013, 15 pages.
Final Office Action for U.S. Appl. No. 13/613,540 dated Apr. 25, 2014, 19 pages.
International Preliminary Report on Patentability for International Application No. PCT/US2012/064672, dated May 20, 2014, 5 pages.
International Search Report, International Application No. PCT/US2012/064762, issued May 15, 2013, four (4) pages.
Written Opinion of the International Searching Authority, International Application No. PCT/US2012/064762, issue May 15, 2013, six (6) pages.
International Search Report for International Application No. PCT/US2012/064672 dated Mar. 12, 2013, 3 pages.
International Written Opinion for International Application No. PCT/US2012/064672 dated Mar. 12, 2013, 4 pages.
European Search Report for European Application No. 12850220.0 dated May 20, 2015, 6 pages.
Office Action for U.S. Appl. No. 13/613,540 dated Nov. 24, 2014, 20 pages.
Taiwan Office Action and Search Report dated Jan. 22, 2015 for TW Patent Application No. 101142514, 15 pages.
Office Action dated Oct. 6, 2015 for Japanese Patent Application No. 2014-541395 (6 pages).
Office Action dated Sep. 24, 2015 for Korean Patent Application No. 10-2014-7014342, 8 pages.

* cited by examiner though the HMC. The design is expected to reduce latency,

SEMICONDUCTOR DIE ASSEMBLIES WITH ENHANCED THERMAL MANAGEMENT AND SEMICONDUCTOR DEVICES INCLUDING SAME

CROSS-REFERENCE TO RELATED APPLICATIONS

This application claims the benefit of U.S. Provisional Patent Application Ser. No. 61/559,659, filed Nov. 14, 2011, and the benefit of U.S. Provisional Patent Application Ser. No. 61/559,664, filed Nov. 14, 2011, the disclosure of each of which application is hereby incorporated herein in its entirety by reference. This application is also related to U.S. patent application Ser. No. 13/613,540, filed Sep. 13, 2012, now U.S. Pat. No. 9,153,520, issued Oct. 6, 2015, titled STACKED SEMICONDUCTOR DIE ASSEMBLIES WITH MULTIPLE THERMAL PATHS AND ASSOCIATED SYSTEMS AND METHODS, the disclosure of which is incorporated herein in its entirety by reference.

TECHNICAL FIELD

Embodiments of the present disclosure relate to semiconductor die assemblies with enhanced thermal management, to semiconductor devices including such assemblies, and to related methods.

BACKGROUND

Increased circuit density is an ongoing goal of manufacturers of semiconductor devices. One long-favored configuration is an assembly of vertically stacked semiconductor dice, at least some of which are interconnected electrically and the stacked die assembly being mechanically and electrically connected to higher level packaging, such as a substrate bearing conductive traces.

One configuration employing a plurality of stacked semiconductor dice is a Micropillar Grid Array Package ("MPGA"). Such a package comprises a stack of a plurality (for example four (4)) of dynamic random access (DRAM) semiconductor memory dice vertically interconnected from an uppermost die to a lowermost die, and a plurality of electrically conductive pillars extending from the underside of the lowermost memory die for connection to a logic die, such as, by way of nonlimiting example, a System on a Chip (SoC) die.

The provider of the logic die or the SoC die conventionally mounts their device to an interposer, such as a ball grid array (BGA) substrate, the logic or SoC die including conductive through vias for connection to the conductive pillars on the underside of the MPGA. The MPGA is mounted to the logic die or SoC die on the interposer and the assembly is then overmolded with an encapsulant into a finished Ball Grid Array (BGA) package.

The aforementioned configuration enables fast memory access, and reduces power requirements.

One particularly promising implementation of an MPGA is a so-called "Hybrid Memory Cube" (HMC), a die assembly which incorporates a high-speed logic die below a vertical stack of DRAM dice interconnected with through-silicon vias (TSVs). The DRAM dice are configured specifically to only handle data, while the logic die provides all DRAM control within the HMC. The design is expected to reduce latency, and greatly improve bandwidth and speed, while offering significantly reduced power demand and physical space requirements and providing flexibility for multiple platforms and application through use of different logic dice.

End products of the above designs will find a wide variety of applications including, among others, in mobile electronic devices such as so-called "smart phones," laptop and notebook computers, supercomputers, BLACKBERRY® devices, iPHONE® and iPAD® devices, and DROID® devices.

One significant focus with regard to implementation of the above-referenced designs is effective thermal management of a substantial amount of heat generated during operation by a logic or SoC die at the base of the die assembly so that the maximum operational temperature of each die within the package, commonly referred to as $T_{max}$ does not exceed acceptable limits.

DETAILED DESCRIPTION

Figure 1:
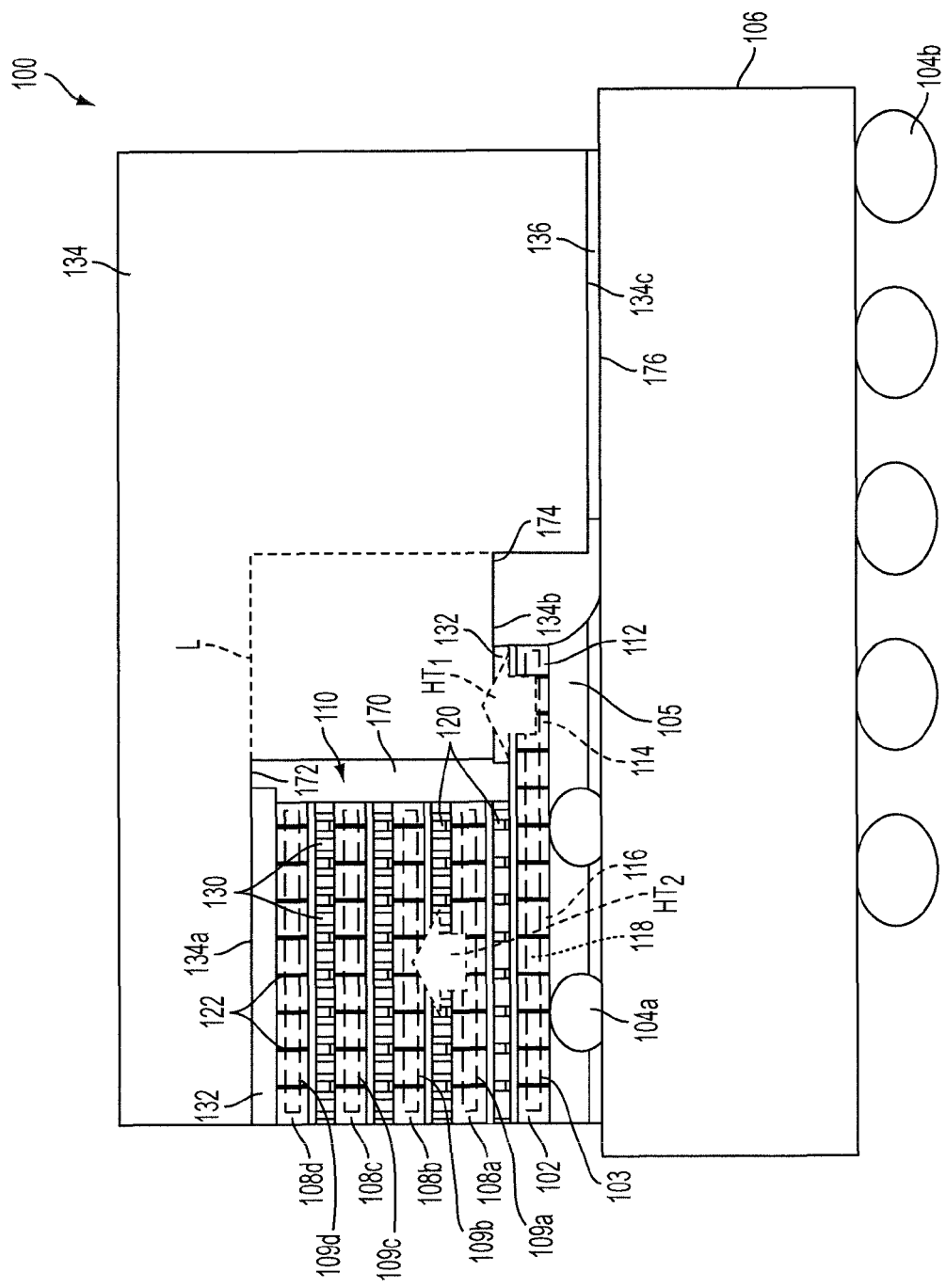
FIG. 1 is a schematic side sectional elevation of a portion of a semiconductor device package configured as a hybrid memory cube.

Semiconductor die assemblies are disclosed, semiconductor devices including same, and methods of fabricating same. As used herein, the term "wafer" means and includes a volume of a semiconductor material in the form of a bulk semiconductor substrate, and is not limited to conventional, substantially circular wafers. As used herein, the term "semiconductor material" means and includes silicon, germanium, gallium arsenide, indium phosphide, and other III-V or II-VI type semiconductor materials. As used herein, the terms "semiconductor die" and "die" and plural forms thereof, means and includes a segment or segments bearing integrated circuitry and singulated from a bulk semiconductor substrate. As used herein, the term "memory die" and plural forms thereof means and includes all forms of integrated circuit memory, including, by way of non-limiting example including DRAM, SRAM, Flash memory, and other memory forms.

The following description provides specific details, such as material types and processing conditions in order to provide a thorough description of embodiments of the present disclosure. However, a person of ordinary skill in the art will understand that the embodiments of the present disclosure may be practiced without employing these specific details. Indeed, the embodiments of the present disclosure may be practiced in conjunction with conventional semiconductor fabrication techniques employed in the industry. In addition, the description provided below does not form a complete process flow for manufacturing a semiconductor device. Only those process acts and structures necessary to understand the embodiments of the present disclosure are described in detail below. Additional acts to form a complete semiconductor device from the semiconductor structures may be performed by conventional fabrication techniques.

In the following detailed description, reference is made to the accompanying drawings, which form a part hereof, and in which is shown, by way of illustration, specific embodiments in which the present disclosure may be practiced. These embodiments are described in sufficient detail to enable a person of ordinary skill in the art to implement embodiments of the present disclosure. However, other embodiments may be implemented, and structural, logical, and electrical changes encompassed by the disclosure may be made. The illustrations presented herein are not meant to be actual views of any particular assembly, memory die, logic die, or system, but are merely idealized representations which are employed to more completely describe the embodiments of the present disclosure. The drawings presented herein are not necessarily drawn to scale. Additionally, elements common between drawings may retain the same or a similar numerical designation.

As employed herein, the terms "about" and "substantially," as used in connection with a given parameter, each mean and include variances from the designated value referenced for that particular parameter within normal manufacturing tolerances, material variations, accuracy of measuring instrumentation, consistency of controls, etc., as the case may be.

Referring now to FIGS. 1 through 4 of the drawings, a semiconductor die assembly and a semiconductor device according to one or more embodiments of the present disclosure are described.

In one embodiment, a semiconductor die assembly comprises a plurality of semiconductor dice in a stack, conductive elements between and interconnecting integrated circuits of semiconductor dice in the stack, thermally conductive structures between semiconductor dice in the stack and electrically isolated from the integrated circuits, and dielectric material located between semiconductor dice in the stack and around the conductive elements and the thermal pillars.

FIG. 1 schematically depicts a portion of HMC 100 configured as a BGA package. Specifically, FIG. 1 depicts one-half of HMC 100, the remaining half of which may comprise a mirror image of the depicted half. However, HMC 100 may or may not be symmetric, and symmetry is not material to implementation and function of embodiments of the disclosure. High-speed logic die 102 is electrically and physically connected using a plurality of external electrically conductive elements 104a to circuitry (not shown) of a substrate in the form of interposer 106, external electrically conductive elements 104a extending through a dielectric encapsulant material 105, such as an epoxy, for enhanced attachment of logic die 102 to interposer 106. Interposer 106, in turn, employs another plurality of external electrically conductive elements 104b for connection to higher-level packaging. While external electrically conductive elements 104a and 104b are depicted as conventional solder balls, other electrically conductive elements comprising a variety of materials and structures including, without limitation, studs, bumps, pillars or columns of metal, conductive epoxy, conductor-filled epoxy, as well as Z-axis anisotropic conductive films, may be employed as signal, power and ground conductors for HMC 100.

High-speed logic die 102 extends peripherally beyond vertically stacked memory dice 108a through 108d on one or more sides of a memory die stack 110. In one embodiment, the memory dice 108a through 108d are DRAM dice. Peripherally extending area 112 of logic die 102, which may also be characterized as a porch or shelf, may comprise a relatively higher power density region 114, while an interior area of logic die 102 comprises a relatively lower power density region 118. Similarly, in another embodiment, interior area 116 of logic die 102 may comprise a relatively higher power density region and peripherally extending area 112 may comprise a relatively lower power density region. In some embodiments, logic die 102 may comprise more than one relatively higher power density region. High power density region 114 may comprise, for example, a SERDES (i.e., Serializer-Deserializer) high-speed communications link. Higher power density region 114 provides a significant heat source during operation of the die assembly and which may be accommodated by embodiments of the disclosure to avoid heat-induced degradation and failure of one or more memory dice 108a through 108d, as well as failure of logic die 102.

Logic die 102 and memory die 108a, as well as memory dice 108b through 108d, are electrically interconnected by a plurality of electrically conductive elements 120, each of which may comprise a discrete element in the form of a pillar, column, stud or bump of a metal material or other electrically conductive material such as a conductive or conductor-filled epoxy. Electrical connections between an active surface and an opposing back side of each of logic die 102 and memory dice 108a through 108d may be effected using conductive through vias 122, which are commonly referred to in the industry as through silicon vias, or "TSVs," as noted above, which are conventionally formed and electrically isolated from surrounding semiconductor material with a dielectric material. In some embodiments, TSVs may extend through only a partial thickness of one or more dice. Various conductive materials, which may be located within a liner comprising a barrier material as desirable, may be used in TSVs for conducting signals, power and ground. Copper is one suitable material for use in TSVs.

Conductive elements 120 and TSVs 122, in addition to providing electrical connections, also provide heat transfer from logic die 102 through memory die stack 110. Such heat transfer is undesirable due to its adverse effect on memory die stack 110 and, particularly, on lowermost memory die 108a due to thermal coupling with logic die 102. Specifically, heat generated by logic die 102, and particularly by the relatively higher power density region 114 and transferred to lowermost memory die 108a, as well as heat generated by memory dice 108a through 108d, often cannot be transferred effectively enough through memory die stack 110 to maintain die operating temperatures below an acceptable maximum. Thus, such heat may result in a $T_{max}$ in memory die 108a (and potentially, over time, in other memory dice 108 in memory die stack 110) higher than acceptable limits, degrading and ultimately damaging memory die 108a. Accordingly, an embodiment of the present disclosure provide features and elements for enhancing thermal management by selectively impeding and enhancing heat transfer within portions of HMC 100 or other multi-die assembly.

In one embodiment, thermally conductive structures in the form of pillars 130, referred to herein as "thermal pillars" to distinguish from electrically conductive elements 120 (hereinafter sometimes "conductive elements"), which may comprise electrically conductive pillars and which electrically interconnect integrated circuitry 103 of logic die 102 and integrated circuitry 109a through 109d of memory dice 108a through 108d, may be used between some or all of memory dice 108a through 108d to selectively facilitate heat transfer through memory die stack 110 to thermal interface material (TIM) 132 and, ultimately, to a heat dissipation structure, which may also be characterized in one form as a heat spreader, and which may be structured as lid 134. Lid 134 may have a heat sink (not shown) with, for example, a plurality of fins or other surface area-enhancing structure thereon for enhanced heat dissipation, connected thereto with a TIM, or may include an integral heat sink structure. Thermal pillars 130 do not electrically connect to integrated circuitry 109a through 109d of memory dice 108a through 108d, but act only as heat transfer conduits between the respective memory dice 108a through 108d of memory die stack 110. Thermal pillars 130 may comprise discrete elements in the form of copper pillars, studs, bumps or pads, a copper pillar or stud with a solder cap, a copper pillar or stud with a nickel barrier layer and a solder cap, or another highly thermally conductive structure comprising one or more suitable materials including, without limitation, copper, tin, silver, and indium. Properties of thermal pillars 130, other than thermal conductivity, are not significant to their function and, so, a wide variety of materials may be utilized.

Figure 2:
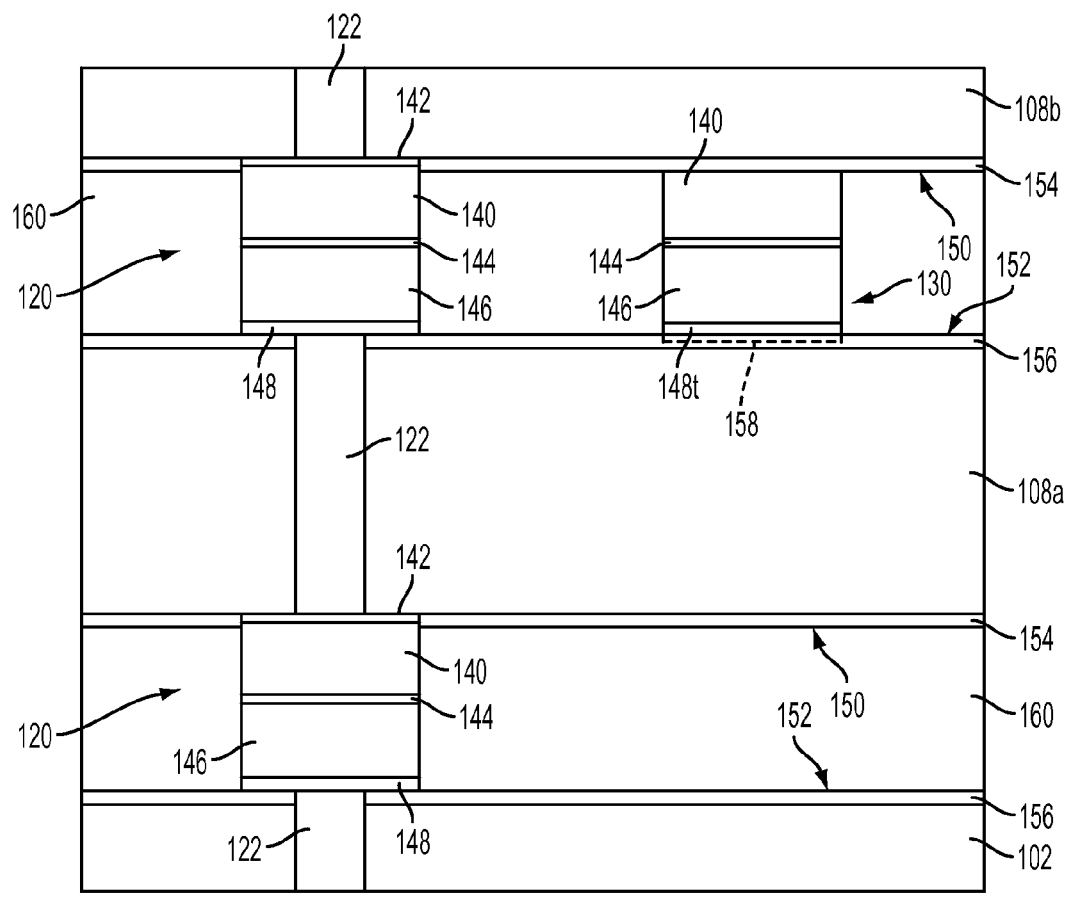
FIG. 2 is an enlarged, schematic side sectional elevation of a portion of the semiconductor device package of FIG. 1.

Notably, at least in some embodiments, no thermal pillars 130 may be employed between logic die 102 and lowermost memory die 108a, in order to limit heat transfer from logic die 102, while thermal pillars 130 are used to facilitate heat transfer from memory die 108a upward through memory dice 108b through 108d and TIM 132 to lid 134. In some embodiments, a lesser number of thermal pillars 130 may be employed between logic die 102 and memory die 108a to provide a lesser heat transfer capability than thermal pillars 130 between memory dice 108a through 108d. FIG. 2 of the drawings depicts an enlarged portion of FIG. 1 including a segment of logic die 102 with segments of superimposed lowermost memory die 108a and second memory die 108b. Electrically conductive elements 120, as depicted, each comprise in the orientation shown in FIG. 1, wherein the logic die 102 and memory dice 108a through 108d are inverted in a so-called "flip chip" orientation, a copper pillar 140 below a bond pad 142, a nickel barrier material 144 below copper pillar 140, and a solder material 146 (for example, Sn/Ag, Sn/Pb) under nickel barrier material 144, the solder 146 upon reflow being bonded to conductive pad 148 on an opposing lower die. While copper pillars 140, as depicted, are formed on an active surface 150 of each memory die 108, it is contemplated that they may reside on a back side 152 of a die and conductive pads 148 may be formed on the active surface 150.

Thermal pillars 130 may be structured the same as, or differently than, conductive elements 120. As depicted in FIG. 2, thermal pillars 130 may each comprise a copper pillar 140, a nickel barrier material 144, and a solder material 146, the latter of which upon reflow is bonded to conductive pad 148 on an opposing die. As depicted in FIG. 2, a thermal pillar 130 may be disposed on active surface passivation 154 of a memory die 108b from which it protrudes. Moreover, conductive pad 148t used with a thermal pillar 130, unlike conductive pad 148 used with a conductive element 120, which is electrically connected through active surface passivation 154 to TSV 122, is not in electrical contact with the memory die 108a on which it resides through a bond pad 142. Rather, conductive pad 148t may be disposed over the passivation 156 of that die, passivation 156 being shown in FIG. 2 as back side passivation.

Conductive pad 148t and in some embodiments a barrier material 158 as shown in broken lines, for example at least one of $SiN_x$, $SiO_x$, may also be disposed directly on back side 152, if thermal pillar 130 is electrically isolated from memory die 108b by active surface passivation 154. Barrier material 158 may comprise silicon oxide over silicon nitride, deposited by chemical vapor deposition. Barrier material 158 may be disposed on back side 152 under conductive pad 148t on back side 152 in the absence of back side passivation 156 to prevent unwanted migration of the material of conductive pad 148 into the semiconductor material of associated memory die 108. Other barrier materials 158 may comprise, without limitation, tungsten nitride and titanium nitride. An additional adhesion material, such as titanium or tantalum, may be disposed over back side 152 prior to deposition of barrier material 158 to facilitate bonding of the barrier material 158 to the semiconductor material of associated die 108.

A dielectric underfill material 160 extends between logic die 102 and lowermost memory die 108a, as well as between each of memory dice 108a through 108d and one or more adjacent memory dice 108a through 108d, extending laterally around conductive elements 120 and thermal pillars 130. A capillary underfill, a pre-applied non-conductive paste, a non-conductive film, a wafer-level underfill, or a molded underfill, may be employed as the dielectric underfill 160, for example.

Further, while thermal pillars 130 have been illustrated and described as of a similar structure and material content as conductive elements 120, such is by way of example and not limitation. For example, thermal pillars 130 may comprise a one-piece copper pillar, or a copper pillar with a solder material cap but no intervening barrier material, or even comprise only a solder bump. In addition, low-temperature solder materials such as indium-based solders may be used for assemblies with low thermal budgets and requiring low operating temperatures, and for enhanced performance. If a thermal pillar 130 carried by one semiconductor die is to merely contact an adjacent semiconductor die but is not necessarily bonded thereto, conductive pad 148 may be omitted and the end of thermal pillar 130 may directly contact a barrier material 158, for example, at least one of $SiN_x$ and $SiO_x$, on the adjacent semiconductor die.

Figure 3A:
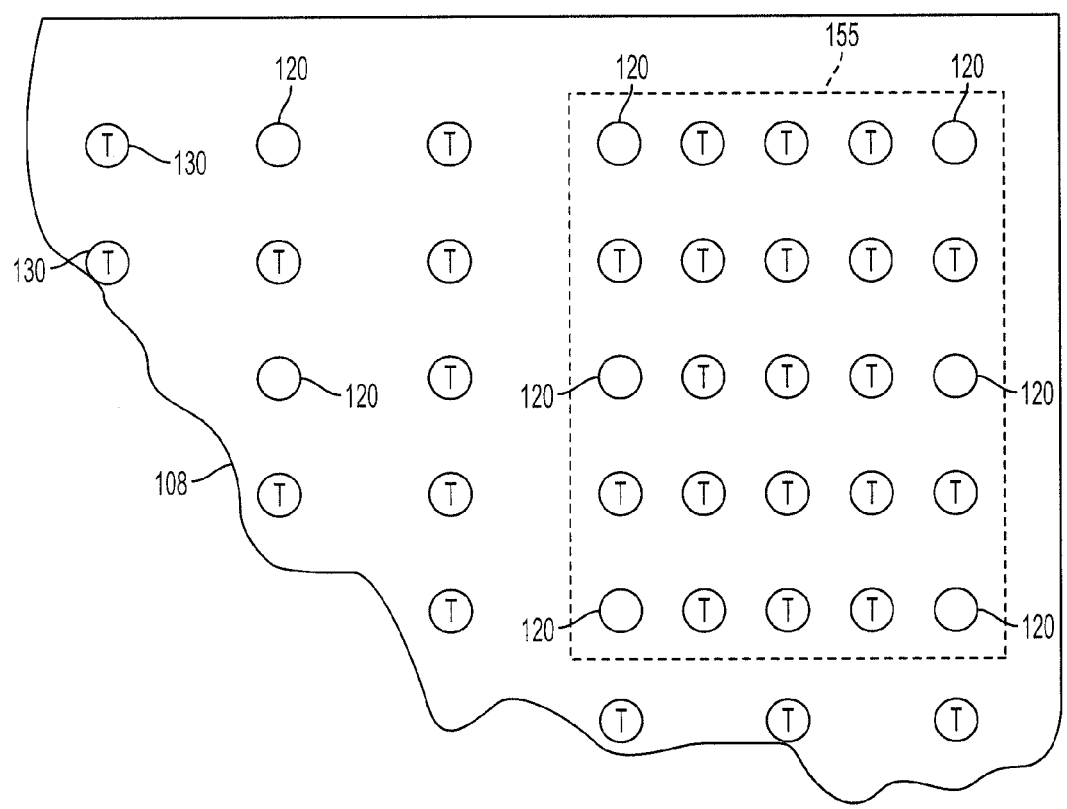
FIGS. 3A through 3C are schematic top elevations of a portion of a semiconductor die having conductive elements and thermal pillars on a surface thereof.
Figure 3B:
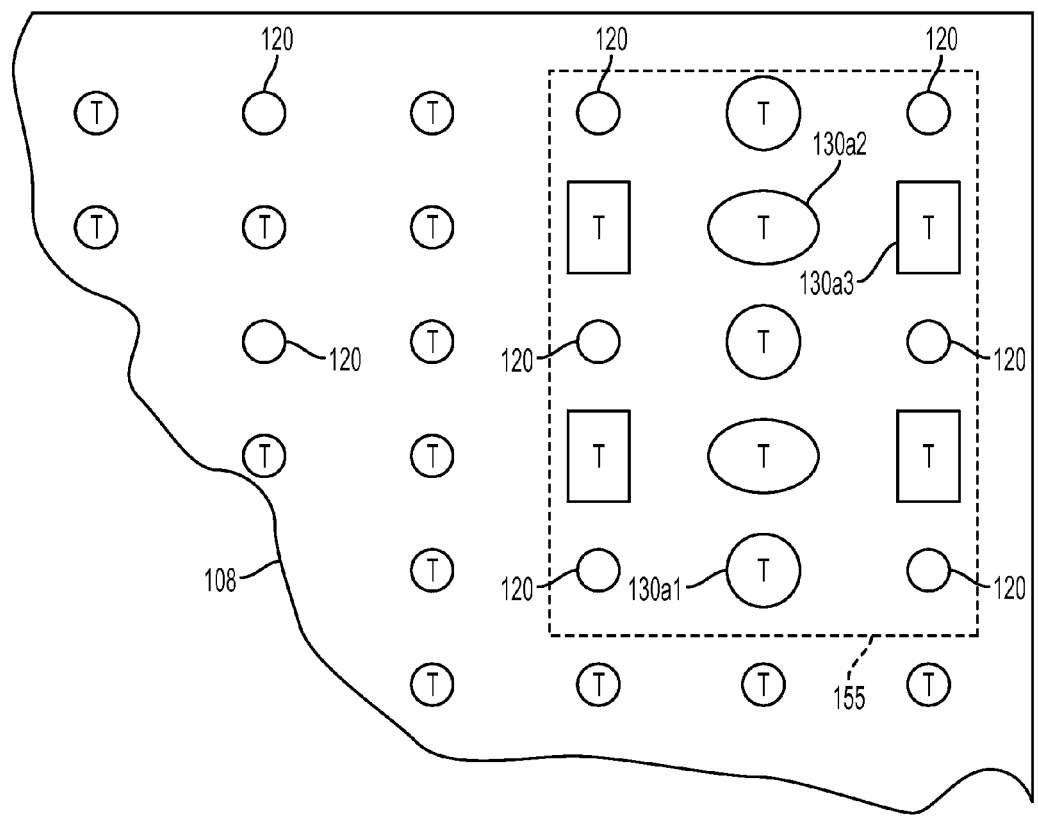
Figure 3C:
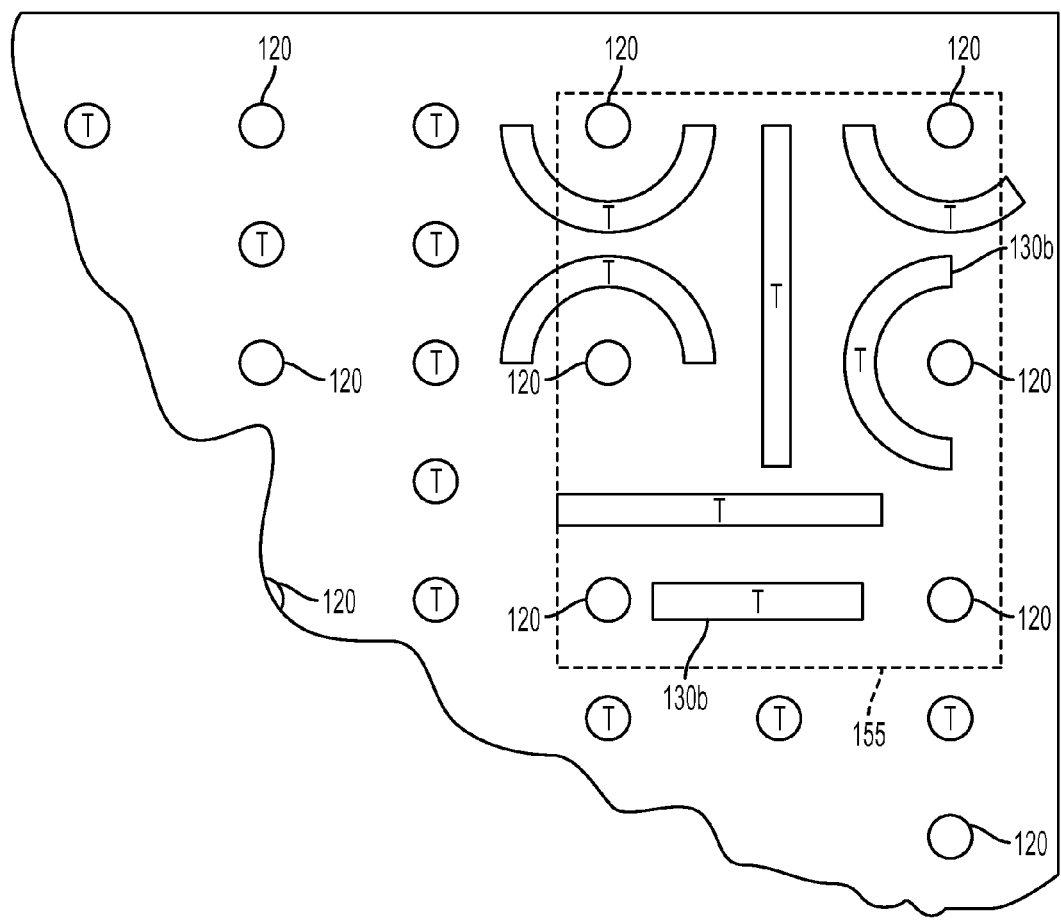

It is contemplated that thermally conductive structures in the form of, for example, thermal pillars 130 may, as illustrated in FIG. 1, be substantially homogeneously distributed across the major (e.g., active and back side) surfaces of memory dice 108a through 108d, to effect substantially uniform heat transfer. However, such thermal pillars 130 may also be non-homogeneously distributed, with more thermal pillars placed in regions exhibiting greater heat generation during operation, such regions being characterized in the industry as "hot spots." Such non-homogeneous distribution of thermal pillars may comprise one or more implementations, alone or in combination. For example, as depicted in FIG. 3A, thermal pillars 130 (also designated with a "T" for clarity) interspersed with conductive elements 120 in the vicinity of (e.g., over) a hot spot 155 may comprise a greater number per unit of surface area and at a smaller pitch than thermal pillars 130 in other areas of a memory die 108. In FIG. 3B, thermal pillars 130a interspersed with conductive elements 120 in the vicinity of hot spot 155 may be of the same number per unit of surface area as thermal pillars 130 in other areas of a memory die 108, but may be of larger transverse cross-sectional surface area, comprising for example, larger cylindrical thermal pillars 130a1, oval thermal pillars 130a2, or rectangular thermal pillars 130a3. In FIG. 3C, thermally conductive structures 130b may not be configured as pillars per se but, rather, as linear or nonlinear wall structures. Accordingly, the term "pillar" as used herein is to be interpreted in an expansive rather than a limiting sense to encompass a variety of thermally conductive structures. Moreover, those of ordinary skill in the art will appreciate that the dimensions and pitch of conductive elements 120 and thermal pillars 130, 130a and 130b are not to scale, as relative feature size has been reduced, and pitch increased, for clarity.

Thus, thermally conductive structures extending between at least two adjacent memory dice may be at least one of sized and arranged to provide a greater heat transfer capability in at least one region within a periphery of the stack than a heat transfer capability in at least one other region within a periphery of the stack.

Further, a plurality of thermally conductive structures may extend between a lowermost memory die in the stack and the logic die, the plurality of thermally conductive structures being at least one of sized and arranged to provide a lesser heat transfer capability between the logic die and the lowermost memory die than a heat transfer capability provided by another plurality of thermally conductive structures extending between adjacent memory dice in the stack.

Figure 4:
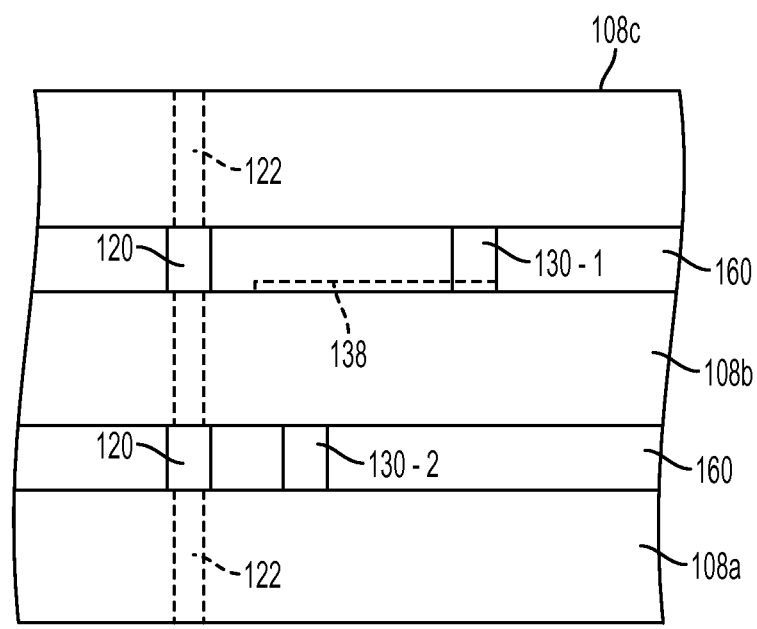
FIG. 4 is an enlarged, schematic side sectional elevation of two stacked semiconductor dice with laterally offset thermal pillars.

It is also contemplated that thermal pillars 130 extending between various memory dice 108 in a stack need not be vertically aligned. For example, as depicted in FIG. 4, a thermal pillar 130-1 extending from memory die 108b to memory die 108c may be laterally offset from a thermal pillar 130-2 extending from memory die 108a to memory die 108b. Further, a heat transfer line 138 of a thermally conductive material, as shown in broken lines, may be extended laterally from a location of thermal pillar 130-1 to a location over thermal pillar 130-2 to facilitate heat transfer between the two thermal pillars 130-1 and 130-2.

In an embodiment, a semiconductor die package comprises a stack of memory dice over a logic die having a peripherally extending area, thermally conductive structures extending between adjacent memory die in the stack and electrically isolated from integrated circuits of the memory dice, and a heat dissipation structure in thermal contact with an uppermost memory die in the stack and with the peripherally extending area of the logic die.

Further enhancements to thermal management may, in some embodiments, include selective use of materials for lid 134 (FIG. 1), which may also be characterized as a heat spreader, in combination with a suitable TIM 132 and a lid seal material 136 (FIG. 1). For example, lid 134 may comprise a metal material such as nickel-coated copper, aluminum, or anodized aluminum, a low coefficient of thermal expansion (CTE) high thermal conductivity ceramic or composite, such as AlSiC, AlN, dialloy (diamond/metal alloy), or Si. Lid 134 may comprise a single piece, or multiple pieces, for ease of fabrication and assembly and to selectively tailor heat transfer characteristics of one or more portions of lid 134. In addition, micro heat pipes may be employed in lid 134, but such structures add complexity and, thus, expense.

TIM 132 may comprise a polymer TIM, for example a silicone-based gel or adhesive, or an epoxy. TIM 132 may also comprise a metal TIM, such as an indium or other (Sn, Ag, etc.) solder, or may comprise a more sophisticated material, such as diamond-like carbon (DLC) or carbon nanotubes. It is noted that TIM 132 can, but does not need to provide an adhesive or other bonding effect between uppermost memory die 108d and lid 134, as lid 134 is secured to interposer 106 by a lid seal material 136. One suitable selection for a TIM 132 is a polymer-based, metal-filled TIM.

Referring again to FIG. 1, it should be noted that in some embodiments lid 134 may be configured with regard to selected proximity to memory die stack 110 and peripherally extending area 112 of logic die 102, wherein a first portion 134a of lid 134 is in thermal contact with the uppermost memory die 108d through a segment of TIM 132, another lid portion 134b is in intimate thermal contact with peripherally extending area 112 of logic die 102 through another segment of TIM 132, and a further lid portion 134c is in thermal contact with interposer 106 through a lid seal material 136. Lid 134 is configured with a cavity 170 within which both memory dice 108a through 108d and logic die 102 are received, cavity floor 172 of lid portion 134a providing a thermal contact area for memory die 108d, step 174 of another lid portion 134b providing a thermal contact area for extended peripheral area 112 of logic die 102, and step 176 of further lid portion 134c providing a thermal contact area with interposer 106. Thus, two separate heat transfer paths are provided.

In such an embodiment, a semiconductor device comprises a plurality of memory dice in a stack, thermally conductive structures between adjacent memory dice in the stack, a dielectric material between the adjacent memory dice and around the thermally conductive elements, a logic die at a base of the stack and comprising a relatively higher power density region and a relatively lower power density region, wherein at least a portion of the relatively higher power density region extends peripherally beyond at least one side of the stack, a substrate of greater peripheral lateral extent than the logic die under the logic die, and a lid disposed over the stack of memory dice and the logic die in thermal contact with the substrate and in thermal contact with an uppermost memory die of the stack and with the relatively higher power density region of the logic die.

Lid seal material 136 may take a number of different forms such as, for example, a silicone-based or epoxy-based adhesive, or a solder. Another approach may be taken, such as the use of Si—Si or Cu—Cu direct lid sealing between lid 134 and interposer 106. One suitable selection for a lid seal material 136 is a silicone-based adhesive, offered as EA-6700 Microelectronic Adhesive by Dow Corning Corporation of Midland, Mich.

With regard to the structures of logic die 102 and memory dice 108a through 108d, suitable selection of passivation materials may, in some embodiments, be employed to impede or enhance heat transfer, as desired. For example, a conventional polymer-based passivation material may be employed on the major surface of logic die 102 facing lowermost memory die 108a, and, optionally, on the facing major surface of memory die 108a. Such materials, for example a polyimide, polybenzoxazole (PBO), or bismaleimide-triazine (BT) resin, exhibit a low thermal conductivity, on the order of 0.2 W/mK. Use of such a material beneficially impedes heat transfer from logic die 102 to memory die 108a. On the other hand, passivation materials which act as effective diffusion barriers and exhibit higher thermal conductivity, on the order of 2.0 W/mK, may be employed both as an active surface passivation 154 and as a back side passivation 156 on memory dice 108a through 108d to facilitate heat transfer to lid 134. Suitable materials include, for example and without limitation, $SiN_x$, $SiO_x$, or spin-on-glass (SOG). While crystalline $Si_3N_4$ is commonly quoted as having a thermal conductivity of 30 W/mK, using low temperature deposition conditions such as are employed in wafer processing, a lower k of 2.0 W/mK may result. K values can be dramatically increased to in excess of 100 W/mK by adding, for example, $Al_2O_3$, $Y_2O_3$, $NdO_x$. Of course, use of a relatively thin passivation layer facilitates heat transfer between a memory die 108 and a contacting thermal pillar 130.

Underfill material 160 may comprise any suitable dielectric material or materials, as noted above. However, it may be desirable to employ an underfill exhibiting a relatively low thermal conductivity (e.g., low k) between logic die 102 and DRAM die 108a to inhibit heat transfer, while employing another, different underfill material exhibiting a relatively high thermal conductivity (e.g., high k) between DRAM dice 108a through 108d to enhance heat transfer. For example, boron nitride, silica-coated aluminum nitride, and aluminum oxide fillers have been proposed to enhance thermal conductivity of underfill materials. A suitable underfill for disposition between logic die 102 and memory die 108a may be a conventional capillary underfill, which may exhibit a thermal conductivity of about 0.2 to about 0.5 W/mK. A conventional non-conductive, no-flow epoxy paste exhibiting a thermal conductivity of about 0.5 W/mK may be disposed between mutually adjacent memory dice 108a through 108d. However, the same or different underfill materials 160 may be employed between logic die 102 and memory die 108a, and between each of memory dice 108a through 108d.

From a broader perspective, different dielectric materials exhibiting different thermal conductivities may be employed between different semiconductor dice in a stack to, respectively, enhance or inhibit heat transfer between adjacent dice in the stack. Similarly, dielectric materials exhibiting different thermal conductivities may be placed between different, laterally spaced regions of vertically adjacent semiconductor dice to selectively enhance or impede vertical heat transfer. For example, relatively higher power density regions of superimposed semiconductor dice in a stack may be vertically aligned and a high thermal conductivity dielectric material may be employed between the semiconductor dice aligned with the relatively higher power density regions to provide, an enhanced heat transfer conduit, while laterally adjacent or surrounding areas between the adjacent semiconductor dice may be filled with a lower thermal conductivity dielectric material to inhibit heat transfer.

Thermal pillars 130, for example, of copper with a nickel barrier between the copper and a solder cap, may exhibit a thermal conductivity on the order of about 30 W/mK over passivation. Thus, the presence of thermal pillars 130 of sufficient transverse cross-sectional area and in sufficient numbers may compensate for the relatively limited thermal conductivity of an underfill material 160. Of course, employing a low-k underfill material 160 in conjunction with the absence of thermal pillars 130 between logic die 102 and lowermost memory die 108a may be employed to desirably inhibit heat transfer between logic die 102 and lowermost memory die 108a.

To place embodiments of the present disclosure in perspective, selective use of structures and materials may be employed to selectively substantially thermally couple or decouple different regions of a multi-die assembly to maintain all components thereof at an operating temperature below $T_{max}$ for each die of the assembly. Approached from another viewpoint, embodiments of the present disclosure may be employed to selectively and beneficially redistribute heat generated by various dice of a multi-die assembly.

Thus, an embodiment of the disclosure comprises a method of distributing heat generated within a semiconductor die assembly comprising a stack of semiconductor dice having a first $T_{max}$ specification electrically connected with another semiconductor die having a second, greater $T_{max}$ specification, the method comprising enhancing heat transfer from a semiconductor die of the stack immediately adjacent the other semiconductor die with thermally conductive structures other than electrically conducting elements between semiconductor dice of the stack through a furthermost semiconductor die of the stack from the other semiconductor die to a heat dissipation structure, inhibiting heat transfer from the other semiconductor die to the immediately adjacent semiconductor die of the stack, and transferring heat directly from the other semiconductor die to a heat dissipation structure.

To provide perspective, one may take the case of an HMC 100 employing a logic die 102 and four DRAM dice 108a through 108d stacked thereon. As depicted in FIG. 1, extended peripheral area 112 of logic die 102, which may comprise a higher power density region 114, extends peripherally beyond one or more sides of die stack 110. The high power density region 114 of logic die 102, which produces a localized hot spot in the die assembly, may cause an increase of $T_{max}$ among the dice of the assembly of 30° C. in a conventional package employing a DRAM die stack 110 over a logic die when conventional heat management techniques are employed, even when using copper TSVs.

For example, and again referring to FIG. 1, a conventional lid, also referred to as a heat spreader, is only in thermal contact with the top of die stack 110 through TIM 132, the internal profile of such a lid being shown by broken line L, so that extended peripheral area 112, which may comprise a higher power density region 114, is out of contact with the lid. As a result, the primary heat transfer path available from peripherally extending area 112 of logic die 102 to the lid with internal profile L is through memory die stack 110. The bottom DRAM die 108a, in particular, sees a markedly increased heat flow from logic die 102. This results in a dramatically higher junction temperature, $T_j$ and $T_{max}$, than required by specifications. In contrast, one or more embodiments of the disclosure provide a first heat transfer path (arrow $HT_1$) for peripherally extending area 112 of logic die 102 through TIM 132 and step 174 of lid 134 to substantially bypass DRAM dice 108a through 108d. Another, second heat transfer path $HT_2$ for heat from lowermost memory die 108a and any residual heat from logic die 102 is provided by thermal pillars 130 through memory dice 108b through 108d and TIM 132 to lid 134. Thus, embodiments of the disclosure provide two decoupled heat transfer paths $HT_1$ and $HT_2$ to enhance thermal management for HMC 100, achieve a lower operating temperature for bottom DRAM die 108a and have both logic die 102 and DRAM dice 108a through 108d meet their respective temperature specifications.

In the specific example under discussion, $T_{max}$ for logic is <105° C., and for DRAM <95° C. A mathematical thermal simulation was performed, using commercially available finite element analysis ANSYS® MECHANICAL computer aided engineering (CAE) software, from ANSYS, Inc., of Canonsburg, Pa. for a stack of four DRAM dice 108a through 108d plus one logic die 102. Parameter values for the simulations performed are set forth hereafter. Boundary conditions of 11.2 W power on logic die 102, and 1.6 W power on each DRAM die 108 were employed, with no dissipation of heat flux via the substrate (e.g., interposer 106) side of the assembly. Logic die 102 and each of DRAM dice 108a through 108d were specified to be of silicon of about 50 μm thickness and having a thermal conductivity (k) of 140 W/mK at ambient temperature and 110 W/mk at operating temperature. Underfill between dice was of a k=0.5 W/mK, and passivation on the active surface of each die was specified at 4 μm of polyimide with a k=0.2 W/mK. Back side passivation for each die was specified to be 1.5 to 2 μm of polyimide with another 0.5 μm of silicon nitride with a k=2.0 W/mK, and TSVs 122 within each die to be of a k=398 W/mK with a dielectric liner of k=1.5 W/mK. TIM 132 was specified to be of a 3.8 W/mK thermal conductivity. As modeled, with conductive elements 120 comprising a 30 μm diameter copper pillar with nickel barrier layer and SnAg solder and having a thermal conductivity of 98 W/mK in communication with TSVs but no thermal pillars 130 between any dice and employing a conventionally configured lid not in contact with peripherally extending area 112 of logic die 102 (as depicted by broken line L in FIG. 1), $T_{max}$ logic was 127.7° C., while $T_{max}$ for the bottom DRAM was 108.9° C. Using a lid 134 according to the disclosure and as described with respect to FIG. 1 with 50 μm thickness of TIM 132 having a thermal conductivity of 3.8 W/mK and a 400 μm overlap of the lid 134 on peripherally extending area 112 of the logic die 102, $T_{max}$ logic was reduced to 105.9° C., while $T_{max}$ bottom DRAM was reduced to 98.9° C. Adding electrically isolated thermal pillars 130 of 30 μm diameter and of a thermal conductivity of 30 W/mK over passivation at a pitch of 100 μm between all dice of the assembly resulted in a $T_{max}$ logic of 99.0° C., while $T_{max}$ bottom DRAM was reduced to 95.5° C., which was within specification for the logic die 102 but still out of specification for the bottom DRAM die 108a. However, eliminating thermal pillars 130 from between the bottom DRAM die 108a and the logic die 102 resulted in $T_{max}$ logic of 102.8° C. and $T_{max}$ DRAM of 93.0° C., well within specification. It is contemplated that some thermal pillars might be employed between logic die 102 and DRAM die 108a to further reduce logic die temperature without heating DRAM die 108a out of specification.

As described above, a method of managing heat transfer in an assembly comprising a plurality of semiconductor dice comprises impeding heat transfer from a portion of a higher power die to an adjacent lower power die, enhancing heat transfer from the adjacent lower power die to at least one other lower power die, and transferring heat from another portion of the higher power die to an adjacent heat dissipation structure.

Also as described above, an embodiment of the disclosure may be characterized as a multi-die assembly, comprising a semiconductor die stacked over another semiconductor die, and a plurality of laterally spaced, thermally conductive structures between, and electrically isolated from, at least one of the semiconductor die and the other semiconductor die.

While illustrated in the context of a stack of individual memory dice 108a through 108d, the disclosure also contemplates the use of greater or fewer memory dice, as well as the use of multiple stacks of memory dice, each stack on a logic die, as well as stacked partial wafer segments each comprising more than one memory die, superimposed on a wafer segment comprising more than one logic die.

In addition to the above-enumerated advantages provided by embodiments of the present disclosure, it should also be noted that the formation of thermal pillars 130 in conjunction with conductive elements 120 by electroplating or electroless plating, such as may be effected on a wafer scale, results in enhanced uniformity of plating of both types of structures.

The disclosure also contemplates the implementation of one or more embodiments of multi-die assemblies incorporating semiconductor dice other than memory and logic dice with structures and materials for thermal management in the form of selective thermal transfer impedance, selective thermal transfer enhancement, and selective thermal transfer redistribution within portions of the assembly and with regard to heat transfer to heat dissipation structures for dissipating heat externally. Such heat dissipation structures and combinations thereof include, without limitation, lids, heat sinks, heat spreaders, micro heat pipes, etc.

In various embodiments as described above, a semiconductor die assembly comprises a plurality of semiconductor dice in a stack, another semiconductor die adjacent to the stack comprising a relatively lower power density region and a relatively higher power density, conductive elements between and electrically interconnecting integrated circuits of the semiconductor dice in the stack and of the other semiconductor die, thermal pillars interposed between semiconductor dice of the stack, and a heat dissipation structure in thermal contact with an uppermost die of the stack and the relatively higher power density region of the other semiconductor die.

While the disclosure is susceptible to various modifications and alternative forms, specific embodiments have been shown by way of example in the drawings and have been described in detail herein. However, the disclosure is not intended to be limited to the particular forms disclosed. Rather, the disclosure encompasses all modifications, equivalents, and alternatives falling within the scope of the invention as defined by the following appended claims and their legal equivalents.

What is claimed is:

1. A semiconductor die assembly, comprising:
a plurality of semiconductor dice in a stack;
conductive elements between and interconnecting integrated circuits of the plurality of semiconductor dice in the stack;
thermally conductive structures between the plurality of semiconductor dice in the stack and electrically isolated from the integrated circuits;
a dielectric material located between the plurality of semiconductor dice in the stack and around the conductive elements and the thermally conductive structures;
another semiconductor die located under the plurality of semiconductor dice in the stack, the another semiconductor die comprising a relatively higher power density region within a peripheral area of the another semiconductor die extending laterally beyond the stack; and
a heat dissipation structure disposed over the plurality of semiconductor dice in the stack and the another semiconductor die, the heat dissipation structure in thermal contact with an uppermost die in the stack and with the relatively higher power density region of the another semiconductor die.

2. The semiconductor die assembly of claim 1, further comprising conductive elements between the another semiconductor die and a lowermost semiconductor die in the stack and dielectric material located between the another semiconductor die and the lowermost semiconductor die in the stack and around the conductive elements.

3. The semiconductor die assembly of claim 2, wherein there are no electrically isolated thermally conductive structures between the another semiconductor die and the lowermost semiconductor die in the stack.

4. The semiconductor die assembly of claim 1, wherein the heat dissipation structure is in thermal contact with the uppermost die in the stack and with the relatively higher power density region of the another semiconductor die through a thermal interface material, and is in thermal contact with the substrate through a seal material.

5. The semiconductor die assembly of claim 2, wherein electrically isolated thermally conductive structures between the another semiconductor die and the lowermost semiconductor die in the stack provide a lesser heat transfer capability than a heat transfer capability provided by the thermally conductive structures between the plurality of semiconductor dice in the stack.

6. The semiconductor die assembly of claim 1, wherein the electrically isolated thermally conductive structures comprise at least one of thermal pillars or wall structures.

7. The semiconductor die assembly of claim 6, wherein the electrically isolated thermally conductive structures comprise thermal pillars and the thermal pillars are substantially homogeneously distributed across major surfaces of the plurality of semiconductor dice of the stack.

8. The semiconductor die assembly of claim 6, wherein the electrically isolated thermally conductive structures comprise thermal pillars and the thermal pillars are non-homogeneously distributed across major surfaces of the plurality of semiconductor dice of the stack.

9. The semiconductor die assembly of claim 6, wherein the electrically isolated thermally conductive structures comprise thermal pillars, and thermal pillars between two adjacent semiconductor dice in the stack are vertically aligned with thermal pillars between at least one of the two adjacent semiconductor dice in the stack and at least one other semiconductor die in the stack.

10. The semiconductor die assembly of claim 6, wherein the electrically isolated thermally conductive structures comprise thermal pillars, and at least one thermal pillar between two adjacent semiconductor dice in the stack is laterally offset from at least one other thermal pillar between at least one of the two adjacent semiconductor dice in the stack and at least one other semiconductor die in the stack.

11. The semiconductor die assembly of claim 1, wherein the electrically isolated thermally conductive structures are interspersed with the conductive elements between the plurality of semiconductor dice of the stack.

12. The semiconductor die assembly of claim 1, wherein the plurality of semiconductor dice in the stack comprise memory dice, and the another semiconductor die comprises a logic die.

13. A semiconductor device, comprising:
a plurality of memory dice in a stack;
a plurality of thermally conductive structures, other than conductive elements electrically connecting integrated circuits of adjacent memory dice in the stack, between the adjacent memory dice in the stack;
a dielectric material between the adjacent memory dice and around the plurality of thermally conductive structures;
a logic die at a base of the stack and comprising a relatively higher power density region and a relatively lower power density region, wherein at least a portion of the relatively higher power density region extends peripherally beyond at least one side of the stack;
a substrate of greater peripheral lateral extent than the logic die, under the logic die; and
a lid disposed over the stack of memory dice and the logic die in thermal contact with the substrate and in thermal contact with an uppermost memory die of the stack and with the relatively higher power density region of the logic die.

14. The semiconductor device of claim 13, wherein the plurality of thermally conductive structures comprises at least one of pillars or walls.

15. The semiconductor device of claim 14, wherein the plurality of thermally conductive structures comprises pillars and the pillars are substantially homogeneously distributed across major surfaces of the plurality of memory dice in the stack.

16. The semiconductor device of claim 14, wherein the plurality of thermally conductive structures comprises pillars and the pillars are non-homogeneously distributed across major surfaces of the plurality of memory dice in the stack.

17. The semiconductor device of claim 14, wherein the plurality of thermally conductive structures comprises pillars, and pillars between two adjacent memory dice in the stack are vertically aligned with pillars between at least one of the two adjacent memory dice in the stack and the logic die in the stack.

18. The semiconductor device of claim 14, wherein the plurality of thermally conductive structures comprises pillars, and at least one pillar between two adjacent memory dice in the stack is laterally offset from at least one other pillar between at least one of the two adjacent memory dice in the stack and the logic die in the stack.

19. The semiconductor device of claim 13, wherein the plurality of thermally conductive structures is interspersed with conductive elements between the plurality of memory dice of the stack.

20. The semiconductor device of claim 13, wherein a pattern of the plurality of thermally conductive structures between at least two adjacent memory dice at least partially differs from a pattern of the plurality of thermally conductive structures between at least one of the at least two adjacent memory dice and another memory die.

21. The semiconductor device of claim 13, wherein the plurality of thermally conductive structures between at least two adjacent memory dice are at least one of sized or arranged to provide a greater heat transfer capability in at least one region within a periphery of the stack than a heat transfer capability in at least one other region within a periphery of the stack.

22. The semiconductor device of claim 13, further comprising another plurality of thermally conductive structures between a lowermost memory die in the stack and the logic die, the another plurality of thermally conductive structures being at least one of sized or arranged to provide a lesser heat transfer capability between the logic die and the lowermost memory die than a heat transfer capability provided by the plurality of thermally conductive structures between adjacent memory dice in the stack.

23. A semiconductor die package, comprising:
a stack of memory dice over a logic die having a peripherally extending area;
thermally conductive structures between adjacent memory dice in the stack of memory dice and electrically isolated from integrated circuits of the memory dice; and
a heat dissipation structure in thermal contact with an uppermost memory die in the stack of memory dice and with the peripherally extending area of the logic die.

24. The semiconductor die package of claim 23, further comprising:
a substrate under the logic die, and wherein the heat dissipation structure is in thermal contact with the substrate.

25. The semiconductor die package of claim 24, wherein the heat dissipation structure comprises a lid having a cavity receiving the stack of memory dice and the logic die.

26. The semiconductor die package of claim 25, further comprising a thermal interface material between the lid and the uppermost memory die in the stack of memory dice and between the lid and the peripherally extending area of the logic die.

27. The semiconductor die package of claim 26, further comprising a lid seal material between the lid and the substrate.

28. A semiconductor die assembly comprising:
a plurality of semiconductor dice in a stack;
another semiconductor die adjacent to the stack comprising a relatively lower power density region and a relatively higher power density region;
conductive elements between and electrically interconnecting integrated circuits of the plurality of semiconductor dice in the stack and of the another semiconductor die;
electrically isolated thermal pillars interposed between the plurality of semiconductor dice in the stack; and
a heat dissipation structure in thermal contact with an uppermost die of the stack and the relatively higher power density region of the another semiconductor die.

* * * * *